United States Patent [19]
Wu

[11] Patent Number: 6,018,266
[45] Date of Patent: Jan. 25, 2000

[54] RADIO FREQUENCY SYSTEM HAVING REFLECTIVE DIODE LINEARIZER WITH BALANCED TUNABLE IMPEDANCE LOADS

[75] Inventor: Shih-Chang Wu, Alhambra, Calif.

[73] Assignee: Hughes Electronics Corporation, Los Angeles, Calif.

[21] Appl. No.: 09/195,066

[22] Filed: Nov. 18, 1998

[51] Int. Cl.$^7$ ...................................................... H03F 1/32
[52] U.S. Cl. .......................................... 330/149; 333/109
[58] Field of Search ..................................... 330/149, 286, 330/287, 53; 333/109, 116, 115

[56] References Cited

U.S. PATENT DOCUMENTS

| | | | |
|---|---|---|---|
| 4,902,983 | 2/1990 | Fujiki et al. | 330/149 |
| 4,987,378 | 1/1991 | Eggleston et al. | 330/149 |
| 5,381,110 | 1/1995 | O'Leary et al. | 330/149 |
| 5,742,201 | 4/1998 | Eisenberg et al. | 330/149 |

OTHER PUBLICATIONS

A. Katz et al., "A Reflective Diode Linearizer for Spacecraft Applications," *IEEE MTT–5 Digest*, pp. 661–664 (1985).
G. Sato et al., "A Linearizer for Satellite Communications," International Conference on Communication, Seattle, WA, Jun. 8–12, 1980, pp. 33.3.1–33.3.5.

*Primary Examiner*—Benny Lee
*Assistant Examiner*—Khanh Van Nguyen
*Attorney, Agent, or Firm*—Terje Gudmestad; Georgann Grunebach; Michael W. Sales

[57] ABSTRACT

A radio frequency system includes a reflective diode linearizer. The reflective diode linearizer has a quadrature hybrid circuit with an input, an output, a first tuned port, and a second tuned port. Each of the tuned ports has a reflection circuit in electrical communication. Each reflection circuit includes a first Schottky diode having a cathode in electrical communication with the tuned port, a second Schottky diode having an anode in electrical communication with the tuned port, a first delay line having a first end in electrical communication with the tuned port, a second delay line having a first end in electrical communication with an anode of the first Schottky diode and also in electrical communication with a cathode of the second Schottky diode, and a radio frequency resistive element having a first end in electrical communication with a second end of the first delay line and a second end in electrical communication with a second end of the second delay line and with an electrical ground.

11 Claims, 2 Drawing Sheets

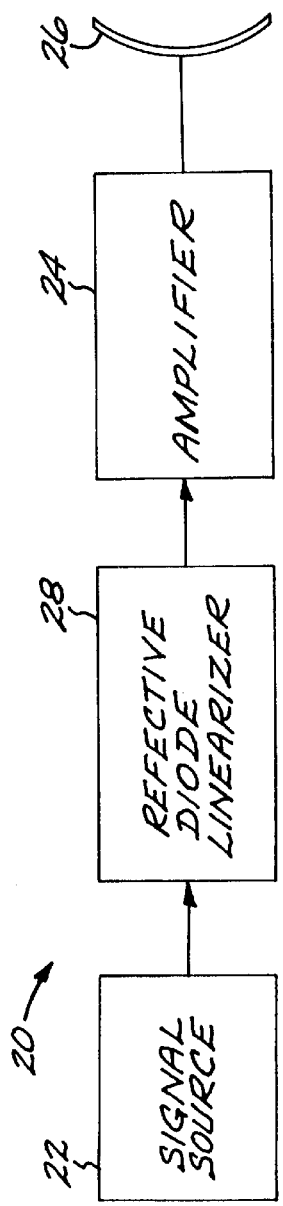
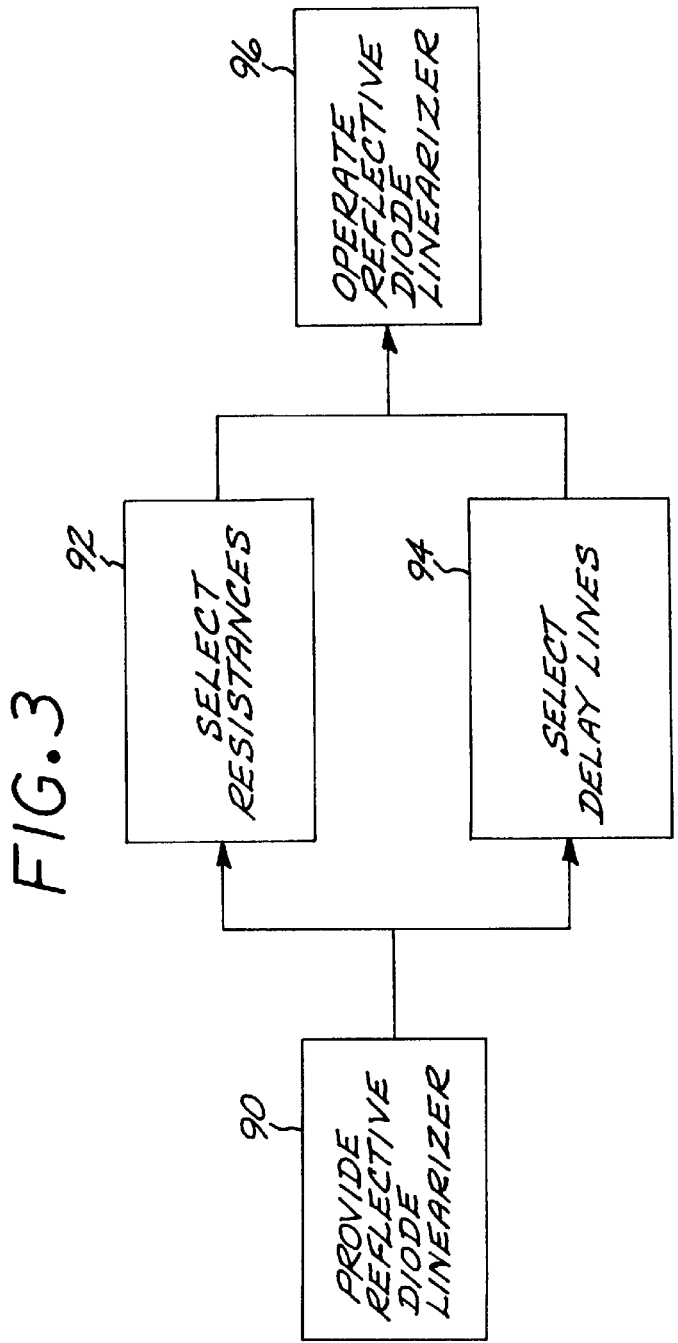

RADIO FREQUENCY SYSTEM HAVING REFLECTIVE DIODE LINEARIZER WITH BALANCED TUNABLE IMPEDANCE LOADS

BACKGROUND OF THE INVENTION

This invention relates to radio frequency (microwave) systems, and, more particularly, to a reflective diode linearizer used in such systems.

Amplifiers are provided in space communications systems to amplify a radio frequency signal prior to transmission. The amplifiers, such as traveling wave tube amplifiers, klystrons, or solid-state power amplifiers, are often required to simultaneously amplify several different carriers. As a result, nonlinear intermodulation products are generated which may interfere with the processing of the transmitted signals.

The intermodulation products may be reduced by reducing the power output of the amplifier. This backoff of the output power operating point reduces signal levels and transmission efficiency, and may require the use of larger, heavier amplifiers.

In another approach, the signals may be processed to alter them to account for the intermodulation effects. Negative feedback, feed-forward, and predistortion techniques are known. In the latter, the signal provided to the amplifier is altered by generating a transfer characteristic which is the opposite of the saturation characteristic of the amplifier in both magnitude and phase, and this altered signal is provided to the amplifier. The result is that the amplified signal does not have the intermodulation products.

Reflective diode linearizers are known for use in predistortion techniques. However, the inventor has observed that these known reflective diode linearizers are based on unbalanced vector summation approaches. The result is poor input and output VSWR (voltage standing wave ratio).

There is therefore a need for an improved approach to the design of reflective diode linearizers and to the predistortion techniques used in space communications systems and other radio frequency communications systems. The present invention fulfills this need, and further provides related advantages.

SUMMARY OF THE INVENTION

The present invention provides a reflective diode linearizer based on a balanced approach. The reflective diode linearizer may be used for predistortion linearization of signals in radio frequency (microwave) amplifier systems. The circuitry is balanced, and permits control over the output characteristics. The input match is maintained for all operating input signal power levels. The gain expansion characteristic of the output may be controlled by the selection of resistor values, and the phase characteristic is accomplished by the proper choice of delay lines. In a preferred form, the circuit is passive.

In accordance with the invention, a system includes a reflective diode linearizer. The reflective diode linearizer comprises a quadrature hybrid circuit having an input, an output, a first tuned port, and a second tuned port. The quadrature hybrid circuit is operable to split a radio frequency signal applied to the input into a first signal reaching the first tuned port and a second signal reaching the second tuned port, wherein the first signal and the second signal have a 90 degree phase difference. The reflective diode linearizer includes two reflection circuits, a first reflection circuit in electrical communication with the first tuned port and a second reflection circuit in electrical communication with the second tuned port. Each of the two reflection circuits comprises a first Schottky diode having a cathode in electrical communication with the tuned port, a second Schottky diode having an anode in electrical communication with the tuned port, a first delay line having a first end in electrical communication with the tuned port, a second delay line having a first end in electrical communication with an anode of the first Schottky diode and also in electrical communication with a cathode of the second Schottky diode, and a radio frequency resistive element having a first end in electrical communication with a second end of the first delay line and a second end in electrical communication with a second end of the second delay line and with an electrical ground.

The delay values of the delay lines may be selected to achieve desired phase characteristics of the output of the quadrature hybrid circuit. (Equivalently for the present purposes, the delay lines may be replaced by varactor diodes having a controllable capacitance.) The resistive values of the resistors may be selected to achieve particular gain expansion characteristics of the output. The delay values for the corresponding delay lines and the resistive values for the corresponding resistors may be the same or different. The radio frequency resistive element is preferably a resistor, but may also be a PIN diode having a controllable resistance.

The system may include an amplifier, with the reflective diode linearizer positioned to process the signal input to the amplifier, or, less desirably, the output of the amplifier. The amplifier may be of any type, with a traveling wave tube amplifier preferred.

With the reflective diode linearizer of the invention, the input VSWR (voltage standing wave ratio) is maintained at all input power levels. The insertion loss is minimized. The insertion loss is governed by the diode characteristics at high input power levels. At low input power levels, the maximum insertion loss is determined by the resistance of the resistors.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is a block diagram of a radio frequency system utilizing a reflective diode linearizer according to the invention;

FIG. 3 is a block diagram of a preferred approach for practicing the method according to the invention.

DETAILED DESCRIPTION OF THE INVENTION

Figure 2:
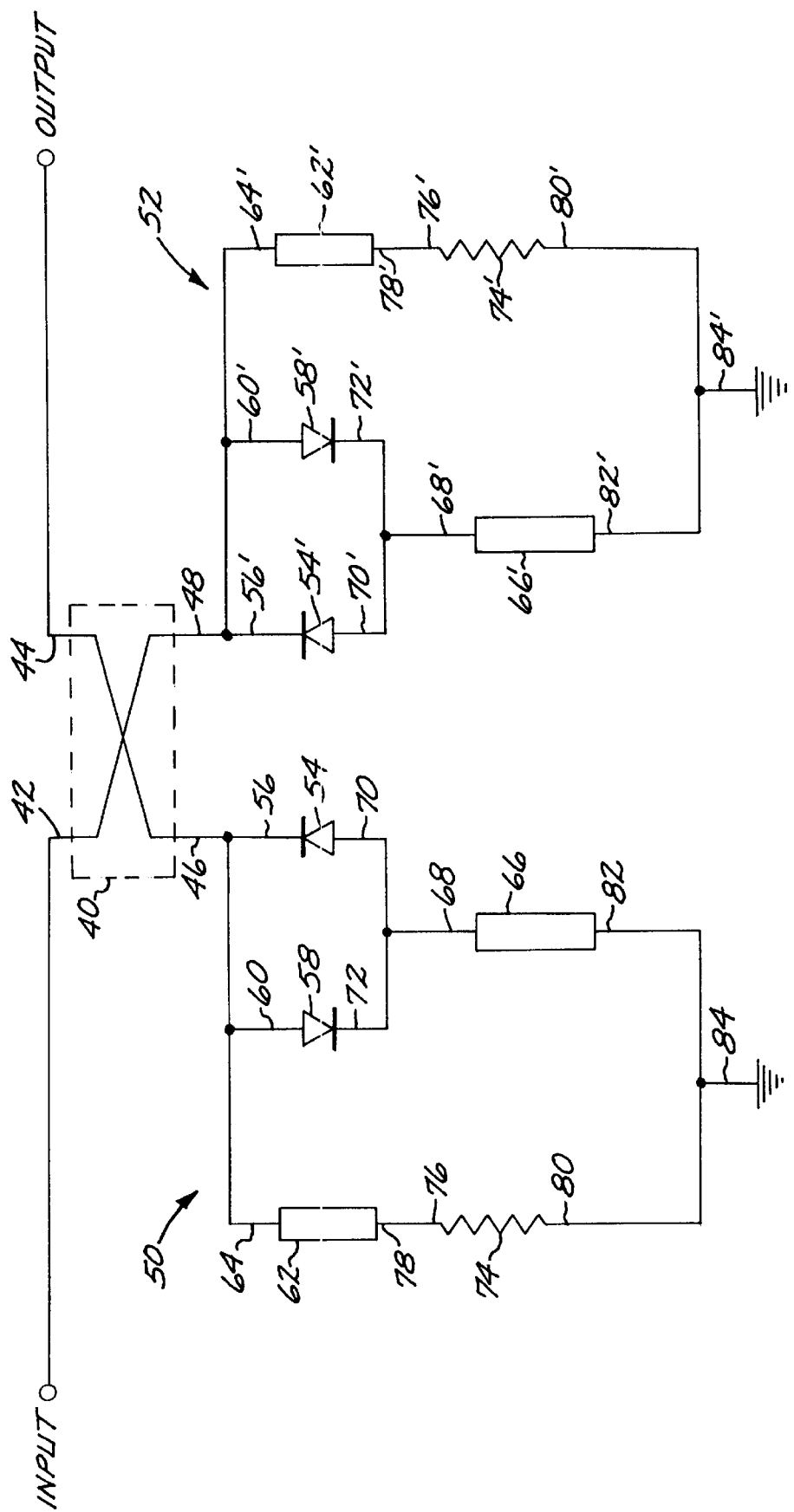
FIG. 2 is a circuit diagram of the preferred form of the reflective diode linearizer of the invention.

FIG. 1 depicts a preferred example of a radio frequency (microwave) system 20 in which a signal source 22 provides a radio frequency signal to an amplifier 24, such as a traveling wave tube amplifier or solid state power amplifier. The output of the amplifier 24 is provided to an antenna 26, from which it is projected. A reflective diode linearizer 28 is positioned between the signal source 22 and the amplifier 24, such that the output signal of the signal source 22 passes through the reflective diode linearizer 28 prior to reaching the amplifier 24. Signal sources 22, amplifiers 24, and antennas 26 for use in radio frequency systems are well known in the art.

A preferred form of the reflective diode linearizer 28 is shown in FIG. 2. The reflective diode linearizer 28 includes a quadrature hybrid circuit 40 having an input 42, an output 44, a first tuned port 46, and a second tuned port 48. The quadrature hybrid circuit 40 splits a radio frequency signal applied to the input 42 into a first signal reaching the first tuned port 46 and a second signal reaching the second tuned port 48. The first signal and the second signal have a 90 degree phase difference and are equal in magnitude. Such quadrature hybrid circuits 40 are known in the art, and include, for example, Lange couplers and branch-line couplers.

A first reflection circuit 50 is in electrical communication with the first tuned port 46. A second reflection circuit 52 is in electrical communication with the second tuned port 48. The reflection circuits 50 and 52 are identical in the arrangement of their electrical components, providing a basically balanced circuitry which may be tuned by selecting values of individual components. Only the components of the first reflection circuit 50 will be described in detail, it being understood that the description applies to the second reflection circuit 52 as well. The components of the second reflection circuit 52 are identified by the same elements as those of the first reflection circuit 50, with primes (') added to permit subsequent differentiation.

In the reflection circuit 50, a first Schottky diode 54 has a cathode 56 in electrical communication with the first tuned port 46. A second Schottky diode 58, connected in antiparallel arrangement with the first Schottky diode 54, has an anode 60 in electrical communication with the first tuned port 46. A first delay line 62 has a first end 64 in electrical communication with the first tuned port 46.

A second delay line 66 has a first end 68 in electrical communication with an anode 70 of the first Schottky diode 54 and also in electrical communication with a cathode 72 of the second Schottky diode 58.

Equivalently for the present purposes, the delay lines may be varactor diodes having a controllable capacitance. The term "delay line" as used herein encompasses such varactor diodes having a controllable capacitance.

A radio frequency resistive element is provided in the circuit. The radio frequency resistive element is preferably a resistor 74. The radio frequency resistive element may instead be a PIN diode. The PIN diode embodiment allows the resistance of the radio frequency resistive element to be varied, but has a higher chance of failure and requires active control. The resistor 74 is therefore preferred, and that embodiment will be described in detail. The resistor 74 has a first end 76 in electrical communication with a second end 78 of the first delay line 62, and a second end 80 in electrical communication with a second end 82 of the second delay line 66 and with an electrical ground 84.

The second reflection circuit 52 has identical elements. The description of the first reflection circuit 50 is incorporated here and applied to the second reflection circuit 52.

In operation, an input radio frequency signal applied to the input 42 is split by the quadrature hybrid circuit 40 into two signals provided at the tuned ports 46 and 48, which are equal in magnitude but 90 degrees out of phase. The diodes allow the radio frequency impedance of the reflection circuits 50 and 52 to vary as a function of the input power level, so that the magnitude of the reflected waves is a function of the signal power applied to the input 42. Where the signal power applied to the input 42 is low, the diodes are open-circuit. The radio frequency power responds to the resistors 74 (and 74'). For example, if the resistances 74 and 74' are properly selected, all of the radio frequency power is dissipated by the resistors. On the other hand, where the signal power applied to the input 42 is high, the diodes behave as components with a small resistance. The radio frequency signal responds to a short-circuit mismatch, and the majority of the radio frequency power is reflected.

Because of the balanced structure, with the circuitry of the two reflection circuits 50 and 52 the same, the reflected signals are of equal magnitude with a 90 degree phase difference. With an additional 90 degree phase shift in the quadrature hybrid circuit 40, the recombined signals are in-phase at the output 44 and out-of-phase at the input 42. The result is a good input match condition for all input power levels.

In operation and as illustrated in FIG. 3, the reflective diode linearizer 28 as described is furnished, numeral 90. The resistance values of the resistors 74 and 74' are selected and installed, numeral 92. The resistance values of the resistors 74 and 74' are preferably the same. The delay line times (i.e., delay line lengths) of the delay lines 62, 62', 66, and 66' are selected and installed, numeral 94. The delay line times (lengths) of delay lines 62 and 62' are preferably the same, and the delay line times (lengths) of delay lines 66 and 66' are preferably the same. However, the delay line times (lengths) of delay lines 66 and 62 may be different, to achieve an adjustable phase shift. The reflective diode linearizer 96 is thereafter operated, numeral 96.

The present invention has been practiced with a reflective diode linearizer 28 using Hewlett Packard beamlead Schottky diodes 54, 54', 58, and 58'. The delay lines 62, 62', 66, and 66' were tested with delay times corresponding to preferred delay line lengths ranging from 0.100 inch to 0.650 inch, and the resistors 74 were tested with preferred resistances ranging from 30 ohms to 60 ohms. The testing was performed at an input frequency of 1.2 GHz, and the quadrature hybrid circuit 40 was a branch-line coupler.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A system including a reflective diode linearizer, comprising:

a quadrature hybrid circuit having an input, an output, a first tuned port, and a second tuned port, the quadrature hybrid circuit being operable to split a radio frequency signal applied to the input into a first signal reaching the first tuned port and a second signal reaching the second tuned port, the first signal and the second signal having a 90 degree phase difference; and two reflection circuits, a first reflection circuit in electrical communication with the first tuned port and a second reflection circuit in electrical communication with the second tuned port, each reflection circuit comprising a first Schottky diode having a cathode in electrical communication with the first tuned port, a second Schottky diode having an anode in electrical communication with the first tuned port, a first delay line having a first end in electrical communication with the first tuned port, a second delay line having a first end in electrical communication with an anode of the first Schottky diode and also in electrical communication with a cathode of the second Schottky diode, and a radio frequency resistive element having a first end in electrical communication with a second end of the first delay line and a second end in electrical communication with a second end of the second delay line and with an electrical ground.

2. The system of claim 1, wherein the radio frequency resistive element is a resistor.

3. The system of claim 1, wherein the radio frequency resistive element has a controllable resistance.

4. The system of claim 1, wherein the radio frequency resistive element is a PIN diode.

5. The system of claim 1, wherein the values of the first delay line, the second delay line, and the radio frequency resistive element are respectively the same for the first reflection circuit and the second reflection circuit.

6. The system of claim 1, wherein the values of the first delay line and the second delay line are not the same.

7. The system of claim 1, further including an amplifier in electrical communication with one of the input and the output of the quadrature hybrid circuit.

8. The system of claim 7, wherein the amplifier is a traveling wave tube.

9. The system of claim 1, further including an amplifier in electrical communication with the output of the quadrature hybrid circuit.

10. The system of claim 9, wherein the amplifier is a traveling wave tube.

11. A method for linearizing a radio frequency signal, comprising the steps of furnishing a reflective diode linearizer having
a quadrature hybrid circuit having an input, an output, a first tuned port, and a second tuned port, the quadrature hybrid circuit being operable to split a radio frequency signal applied to the input into a first signal reaching the first tuned port and a second signal reaching the second tuned port, the first signal and the second signal having a 90 degree phase difference, and two reflection circuits, a first reflection circuit in electrical communication with the first tuned port and a second reflection circuit in electrical communication with the second tuned port, each reflection circuit comprising
a first Schottky diode having a cathode in electrical communication with the tuned port,
a second Schottky diode having an anode in electrical communication with the tuned port,
a first delay line having a first end in electrical communication with the tuned port,
a second delay line having a first end in electrical communication with an anode of the first Schottky diode and also in electrical communication with a cathode of the second Schottky diode, and
a radio frequency resistive element having a first end in electrical communication with a second end of the first delay line and a second end in electrical communication with a second end of the second delay line and with an electrical ground;

selecting resistance values for the radio frequency resistive elements to control a gain expansion magnitude of the reflective diode linearizer; and selecting delay line times for the delay lines to control the phase relation of an output signal from the output.

* * * * *